(12) United States Patent
Yamamoto et al.

(10) Patent No.: US 8,558,549 B2
(45) Date of Patent: Oct. 15, 2013

(54) DETECTOR CIRCUIT AND SEMICONDUCTOR DEVICE USING SAME

(75) Inventors: Kazuya Yamamoto, Tokyo (JP); Tomoyuki Asada, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 363 days.

(21) Appl. No.: 12/941,134

(22) Filed: Nov. 8, 2010

(65) Prior Publication Data

US 2011/0187349 A1   Aug. 4, 2011

(30) Foreign Application Priority Data

Feb. 4, 2010   (JP) ................................ 2010-023029

(51) Int. Cl.
*G01R 31/00* (2006.01)
*G01R 25/02* (2006.01)

(52) U.S. Cl.
USPC ........................... 324/500; 324/76.11; 324/95

(58) Field of Classification Search
None
See application file for complete search history.

(56) References Cited

U.S. PATENT DOCUMENTS

| | | | |
|---|---|---|---|
| 6,480,705 B1 * | 11/2002 | Kusunoki | 455/126 |
| 7,277,678 B2 * | 10/2007 | Rozenblit et al. | 455/91 |
| 7,911,257 B2 * | 3/2011 | Tsividis et al. | 327/356 |
| 2004/0198465 A1 * | 10/2004 | Nation | 455/573 |
| 2006/0267688 A1 | 11/2006 | Tanoue et al. | |
| 2010/0167667 A1 | 7/2010 | Laporte et al. | |

FOREIGN PATENT DOCUMENTS

| | | |
|---|---|---|
| JP | 6-300803 A | 10/1994 |
| JP | 7-202525 A | 8/1995 |
| JP | 10-341117 A | 12/1998 |
| JP | 2006-319508 A | 11/2006 |
| JP | 2006-333023 A | 12/2006 |
| KR | 2003-0038062 A | 5/2003 |
| KR | 20-0396906 Y1 | 9/2005 |

OTHER PUBLICATIONS

Korean Patent Office, Examination Report in Korean Patent Application No. 10-2010-0118516 (Dec. 15, 2011).
State Intellectlual Property Office of the People'S Republic of China, Office Action in Chinese Patent Application No. 201110040545.1 (Mar. 4, 2013).
Chinese Office Action, application No. 2011100405451, dated Aug. 5, 2013.

* cited by examiner

*Primary Examiner* — Vinh Nguyen
(74) *Attorney, Agent, or Firm* — Leydig, Voit & Mayer, Ltd.

(57) ABSTRACT

A detector circuit for detecting degradation in the distortion characteristics of a power amplifier based on signals from both ends of a coupled line of a directional coupler. The detector circuit includes a phase shifter/attenuator for phase shifting and attenuating a signal from a coupled terminal of the coupled line, a differential amplifier for outputting difference between an output signal from the phase shifter/attenuator and a signal from the isolated terminal of the coupled line, a wave detector circuit for converting the difference into a DC signal, and a comparing circuit for determining whether the voltage level of the DC signal exceeds a predetermined level. When degradation in the distortion characteristics of the power amplifier arises, the phase shifter/attenuator phase shifts the signal from the coupled terminal and outputs a signal 180° out of phase with the signal from the isolated terminal.

11 Claims, 16 Drawing Sheets

DETECTOR CIRCUIT AND SEMICONDUCTOR DEVICE USING SAME

BACKGROUND OF THE INVENTION

1. Field of the Invention

The present invention relates to a circuit for detecting variations in the load at the antenna terminal of the transmitter front end of a portable terminal, etc., and more particularly to a detector circuit for detecting the reflection amplitude and phase at the antenna end. The present invention also relates to a semiconductor device using such a circuit.

2. Background Art

The transmitter front end of a wireless terminal generally includes a directional coupler for monitoring the transmission power level, etc. This directional coupler is inserted, e.g., between the transmission power amplifier and the antenna. In such configurations, the directional coupler is used to monitor the output level (or output power) of the amplifier.

A well known transmitter front end will be described with reference to FIG. 21. A semiconductor device 500 serving as a transmitter front end includes a GaAs-based power amplifier (PA) 508, a directional coupler, an RF-IC 510 (an IC for generating a modulated transmission signal), and an antenna 506. The directional coupler includes a main line 502 and a coupled line 504. The main line 502 has an input terminal #IN and an output terminal #OUT. The coupled line 504 has a coupled terminal #C1 for monitoring the output voltage and an isolated terminal #C2.

FIG. 22 shows variations in the load impedance at the antenna end as indicated by four points A to D. FIG. 23 shows an example of how the RF characteristics of the power amplifier vary with variation in the load at the antenna end. Specifically, FIG. 23 shows the RF characteristics of the power amplifier 508 measured when the phase of the load (a tuner) was changed under the condition that VSWR=6:1. It should be noted that the tuner was used as the load in order to simulate variations in the actual load at the antenna end. This diagram plots the power gain of the power amplifier 508, the operating current Ic2 of the final stage Tr (transistor), and the ACLR (Adjacent Channel Power Leakage), which indicates the distortion characteristics of the amplifier, when the output power of the amplifier is maintained constant (e.g., 27 dBm≈0.5 W).

As shown in FIG. 23, the ACLR is highest (i.e., worst) at the phase at point A. The ACLR at the phase at point B, which is 180° from the phase at point A, is also high and close to the ACLR at point A. The operating current Ic2 of the final stage Tr is minimized at point A and maximized at point B. As for the gain, near-optimum gain matching (i.e., a condition where the gain is high and the operating current is low) is obtained at point A, and near-optimum output power matching (i.e., a condition where the maximum output power is high, but the gain is low and the operating current is high) is obtained at point B.

As in this example, the distortion characteristics of the power amplifier may be degraded due to variation in the load at the antenna end. Particularly it is important and necessary to prevent degradation of the distortion characteristics of CDMA power amplifiers. Conventional methods for preventing degradation of the distortion characteristics due to variation in the load include the use of an isolator (a device which allows power to pass from the input IN to the output OUT but prevents power from passing from the output OUT to the input IN) instead of a directional coupler, and the use of a power amplifier employing a balanced configuration. These methods, however, increases the manufacturing cost of the front end.

SUMMARY OF THE INVENTION

The present invention has been made to solve the above problems. It is, therefore, an object of the present invention to provide a detector circuit that allows for an easy and low cost way to prevent degradation of the distortion characteristics. Another object of the present invention is to provide a semiconductor device adapted to use such a detector circuit.

According to one aspect of the present invention, a detector circuit for detecting a degradation in the distortion characteristics of a power amplifier based on signals from both ends of a coupled line of a directional coupler disposed between the power amplifier and an antenna, the detector circuit includes, a phase shifter/attenuator for phase shifting and attenuating a signal from the coupled terminal of the coupled line, means for outputting the difference between an output signal from the phase shifter/attenuator and a signal from the isolated terminal of the coupled line, a wave detector circuit for converting the difference into a DC signal, and a comparing circuit for determining whether the voltage level of the DC signal exceeds a predetermined level. When the load conditions at the antenna end cause a degradation in the distortion characteristics of the power amplifier, the phase shifter/attenuator phase shifts the signal from the coupled terminal to output a signal 180° out of phase with the signal from the isolated terminal.

According to another aspect of the present invention, a semiconductor device includes a detector circuit for detecting a degradation in the distortion characteristics of a power amplifier based on signals from both ends of a coupled line of a directional coupler disposed between the power amplifier and an antenna, wherein the detector circuit includes a phase shifter/attenuator for phase shifting and attenuating a signal from the coupled terminal of the coupled line, means for outputting the difference between an output signal from the phase shifter/attenuator and a signal from the isolated terminal of the coupled line, a wave detector circuit for converting the difference into a DC signal, and a comparing circuit for producing an output if the voltage level of the DC signal exceeds a predetermined level, and wherein when the load conditions at the antenna end cause a degradation in the distortion characteristics of the power amplifier, the phase shifter/attenuator phase shifts the signal from the coupled terminal to output a signal 180° out of phase with the signal from the isolated terminal, and means for varying the load impedance of the power amplifier in accordance with the output from the comparing circuit to prevent degradation of the distortion characteristics.

Other and further objects, features and advantages of the invention will appear more fully from the following description.

DETAILED DESCRIPTION OF THE PREFERRED EMBODIMENTS

First Embodiment

A first embodiment of the present invention will be described with reference to FIGS. 1 to 6. It should be noted that throughout the description of the first embodiment, certain of the same or corresponding components are designated by the same reference symbols and described only once. This also applies to other embodiments of the invention subsequently described.

Figure 1:
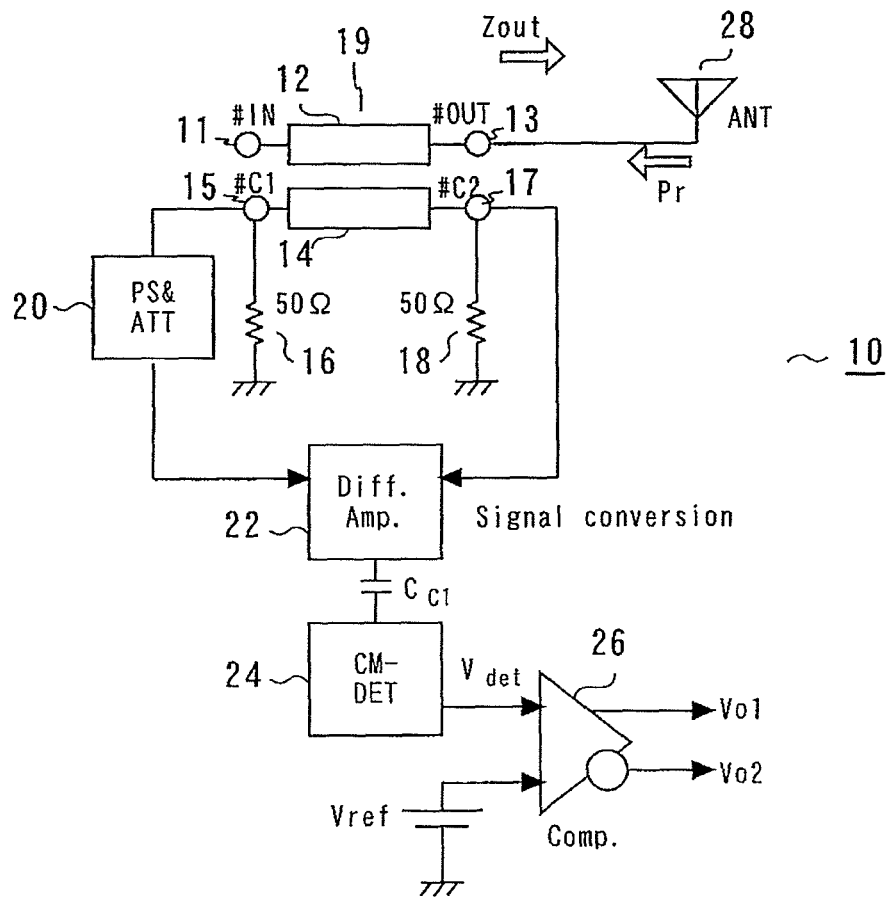
FIG. 1 is a circuit diagram of a detector circuit of the first embodiment.

FIG. 1 is a circuit diagram of a detector circuit 10 of the present embodiment. The detector circuit 10 is adapted to detect the reflection amplitude and phase at the antenna end (28). Specifically, the detector circuit 10 detects the reflection amplitude and phase based on the power from the coupled terminal 15 and from the isolated terminal 17 of the coupled line 14 of a directional coupler 19. The detector circuit 10 is a circuit connected to the coupled line 14 and hence does not include the directional coupler 19 and the antenna 28.

Figure 2:
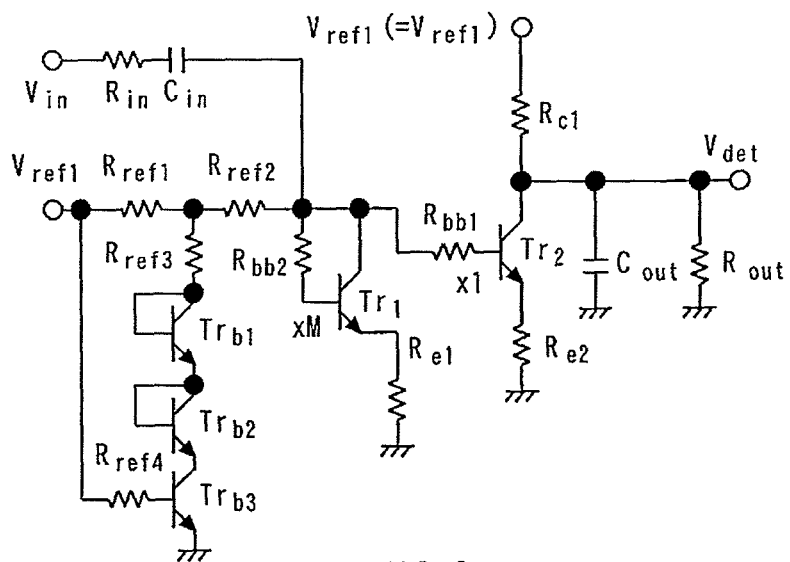
FIG. 2 shows the circuit configuration of the wave detector circuit.

The configuration of the detector circuit 10 will be described. A resistance 16 is connected at one end to one end of the coupled line 14 and at the other end to ground, and a resistance 18 is connected at one end to the other end of the coupled line 14 and at the other end to ground. A phase shifter/attenuator 20 is connected to the coupled terminal 15. The phase shifter/attenuator 20 phase shifts and attenuates the power from the coupled terminal 15. The output of the phase shifter/attenuator 20 and the isolated terminal 17 are connected to a differential amplifier 22. The differential amplifier 22 converts a differential signal into a single phase signal. The output of the differential amplifier 22 is connected to a wave detector circuit 24 through a coupling capacitor Cc1. The wave detector circuit 24 is of the current mirror type and converts the RF signal into a DC signal. FIG. 2 shows the circuit configuration of the wave detector circuit 24. The output of the wave detector circuit 24 is connected to a comparing circuit 26. The comparing circuit 26 compares the output Vdet of the wave detector circuit with a reference voltage Vref and outputs voltages or signals Vo1 and Vo2.

Figure 23:
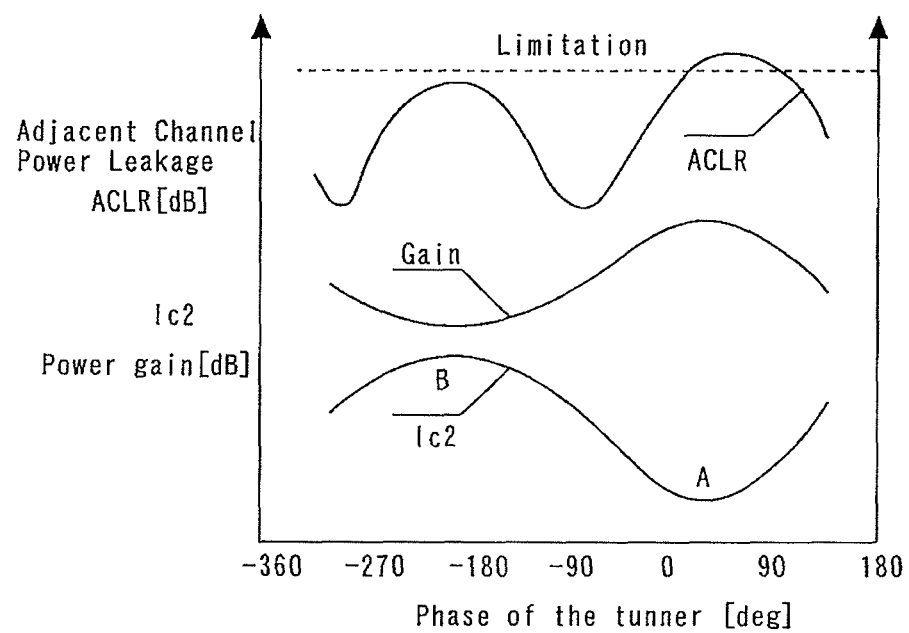
FIG. 23 shows degradation of the distortion characteristics.

The phase shifter/attenuator 20 phase shifts the power from the coupled terminal 15 to output a signal 180° out of phase with the signal from the isolated terminal 17 when the load conditions (or impedance) at the antenna end cause a degradation in the distortion characteristics of the power amplifier. In addition, the phase shifter/attenuator 20 attenuates the power from the coupled terminal 15 so that the output signal from the phase shifter/attenuator 20 is equal in amplitude to the signal from the isolated terminal 17 when they are 180° out of phase. The phase shifter in the phase shifter/attenuator 20 may be implemented with lumped-parameter elements or a delay line (which is merely a long transmission line), etc. Further, the attenuator in the phase shifter/attenuator 20 may be only a series resistance or a resistance attenuator having a π or T configuration. It should be noted that typical load conditions at the antenna end which cause a degradation in the distortion characteristics of the amplifier include, e.g., those indicated by points A and B in FIG. 23.

The operation of the detector circuit 10 will now be described. When reflection occurs at the antenna end (28), the reflected power Pr is coupled out to the isolated terminal 17 (#C2). The signal (or power) transmitted from the input to the output, on the other hand, is coupled out to the coupled terminal 15 (#C1). In this example, the directional coupler is assumed to have a directivity of approximately 10-2 dB (as defined as the ratio of the output power from the coupled terminal 15 to the output power from the isolated terminal 17). The power output from the isolated terminal 17 is input to the differential amplifier 22. The signal (or power) output from the coupled terminal 15, on the other hand, is phase shifted and attenuated by the phase shifter/attenuator 20 and then input to the differential amplifier 22.

Upon receiving the signals from the terminals 15 and 17, the differential amplifier 22 outputs a signal corresponding to the difference between the received signals; that is, the voltage amplitude of the signal output from the differential amplifier 22 is maximized when the received signals are equal in amplitude to each other and are 180° out of phase with each other. The output of the differential amplifier 22 is input to the wave detector circuit 24 through the coupling capacitor Cc1. The wave detector circuit 24 converts the RF signal (i.e., the input to the wave detector circuit 24) into a DC signal. The comparing circuit 26 compares the output from the wave detector circuit 24 with a reference voltage level Vref and, if it exceeds the reference voltage level Vref, the comparing circuit 26 outputs a noninverted signal Vo1 and an inverted signal Vo2.

Thus by using the detector circuit 10 of the present embodiment it is possible to detect the reflection amplitude and phase when the distortion in the output of the power amplifier is greatest. The output of the comparing circuit 26 may be used to vary the load impedance of the power amplifier so as to prevent degradation of the distortion characteristics of the amplifier. That is, this makes it possible to prevent degradation of the distortion characteristics of even common power amplifiers due to load variations, thus providing a low cost way to reduce degradation of the distortion characteristics of power amplifiers. Although the present invention is not primarily intended for balanced power amplifiers (which have relatively good distortion characteristics), the detector circuit of the present embodiment may be used with a balanced power amplifier to further reduce degradation of the distortion characteristics of the amplifier due to load variations.

The construction and operating principle of the detector circuit 10 of the present embodiment are very simple. Therefore, the detector circuit 10 can be manufactured by a GaAs-HBT process or a GaAs-BiFET process (including only n-channel FETs or npn transistors), which are often used to manufacture power amplifiers. This means that the detector circuit 10 can be easily incorporated in power amplifiers.

Although in the present embodiment the phase shifter/attenuator 20 is constructed to produce only a fixed amount of phase shift and a fixed amount of attenuation, it is to be understood that the present invention is not limited to this particular construction. For example, the phase shifter in the phase shifter/attenuator 20 may have the construction shown in FIG. 6. The diagram shown on the right side of FIG. 6 and indicated by the arrow is an exemplary circuit configuration of a variable capacitor. The phase shifter shown in FIG. 6 includes a variable resistance R1, inductors L1 and L2, and variable capacitors C1 and C2. Each of the variable capacitors C1 and C2 includes fixed value capacitances C1$a$ and C1$b$, a resistance R1$a$, and a diode D1, as shown in the diagram indicated by the arrow in FIG. 6. Referring to this diagram, the control voltage Vc applied to the diode D1 through the resistance R1$a$ may be varied from zero to a positive value to change the reverse bias capacitance of the diode D1, thus enabling the diode D1 to function as a variable capacitor. The construction of the variable resistance R1 may be the same as that shown enclosed by the dashed line in FIG. 16 (described later) and include an FET F1, resistances R1$a$ and R2$a$, and a control voltage terminal Vc. Thus, the phase shifter/attenuator 20 may be constructed so that the amount of phase shift and the amount of attenuation produced by the phase shifter/attenuator 20 can be varied to detect different reflection amplitudes and phases. This means that the reflection amplitude and phase to be detected by the detector circuit can be varied even after the power amplifier is mounted on the printed board.

Figure 3:
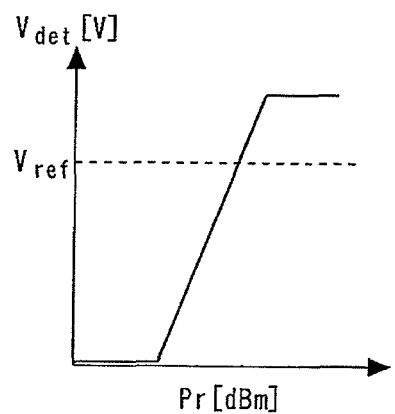
FIG. 3 shows relatively steep and linear wave detection characteristic.

When the detector circuit 10 of the present embodiment is implemented with a GaAs-based device, the wave detector circuit 24 preferably has "steep" DC inversion characteristics. The use of a wave detector circuit with relatively "steep and linear" wave detection characteristics (i.e., a wave detector circuit with a detected voltage (V) vs. input (dB) curve which is relatively steep and linear, as shown in FIG. 3) makes it easy to obtain "steep" DC inversion characteristics, as compared to the use of the conventional wave detector circuit shown in FIG. 5, even if the DC gain of the comparing circuit 26 is low.

Second Embodiment

A detector circuit of a second embodiment of the present invention allows for detection of reflection amplitudes and phases under two different load conditions which cause a degradation in the distortion characteristics of the power amplifier. The present embodiment will be described with reference to FIGS. 7 and 8.

Figure 7:
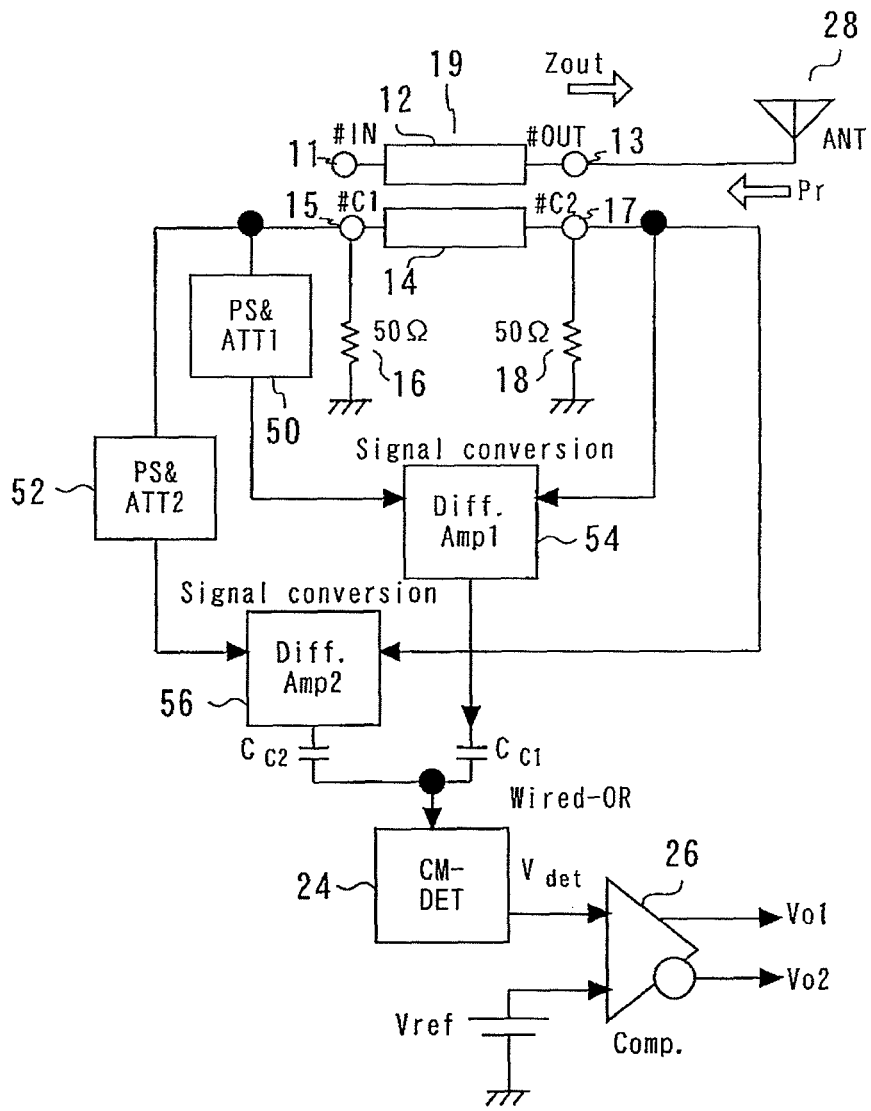
FIG. 7 is a circuit diagram illustrating the detector circuit of the second embodiment.

FIG. 7 is a circuit diagram illustrating the detector circuit of the present embodiment. The phase shifter/attenuator of the present embodiment includes a first phase shifter/attenuator 50 and a second phase shifter/attenuator 52. The first phase shifter/attenuator 50 and the second phase shifter/attenuator 52 are similar to the phase shifter/attenuator 20 of the first embodiment in that they phase shifts and attenuates the power from the coupled terminal 15. However, the first phase shifter/attenuator 50 phase shifts the signal from the coupled terminal 15 so that it is 180° out of phase with the signal from the isolated terminal 17 when, for example, the load conditions at the antenna end are those indicated by point A in FIG. 23. Further, the second phase shifter/attenuator 52 phase shifts the signal from the coupled terminal 15 so that it is 180° out of phase with the signal from the isolated terminal 17 when, for example, the load conditions at the antenna end are those indicated by point B in FIG. 23.

The output of the first phase shifter/attenuator 50 is input to a first differential amplifier 54, and the output of the second phase shifter/attenuator 52 is input to a second differential amplifier 56. The signal from the isolated terminal 17 is input to both the first and second differential amplifiers 54 and 56. The outputs of the first and second differential amplifiers 54 and 56 are input to a wave detector circuit 24 through capacitances Cc1 and Cc2, respectively. The configurations and operations of the wave detector circuit 24 and the comparing circuit 26 connected to the output of the wave detector circuit 24 are the same as those described in connection with the first embodiment.

Thus, the detector circuit of the present embodiment includes two phase shifters/attenuators each connected to a respective differential amplifier. When the load conditions are those indicated by point A in FIG. 23, the resulting degradation in the distortion characteristics of the power amplifier can be detected from the output of the first phase shifter/attenuator 50, since in that case the first phase shifter/attenuator 50 phase shifts and attenuates the signal from the coupled terminal 15 in a predetermined manner. Further, when the load conditions are those indicated by point B in FIG. 23, the resulting degradation in the distortion characteristics of the power amplifier can be detected from the output of the second phase shifter/attenuator 52, since in that case the second phase shifter/attenuator 52 phase shifts and attenuates the signal from the coupled terminal 15 in a predetermined manner. Therefore, the detector circuit of the present embodiment can detect the reflection amplitudes and phases under two different load conditions which cause a degradation in the distortion characteristics of the power amplifier. This means that the present embodiment has a greater effect in preventing degradation of the distortion characteristics of the power amplifier than does the first embodiment.

Further, the outputs of the differential amplifiers 54 and 56 are connected together and to the wave detector circuit 24 in a wired OR manner through the capacitances Cc1 and Cc2. Thus the detector circuit of the present embodiment is small and simple in construction, as compared to detector circuits provided with two separate wave detector circuits. Further, this wired OR configuration allows the power outputs from the differential amplifiers 54 and 56 to cancel out each other before they are input to the wave detector circuit 24, except under the load conditions indicated by points A and B in FIG. 23 and similar load conditions, resulting in "steep" detection characteristics. The second embodiment also has all the advantages of the first embodiment.

Figure 8:
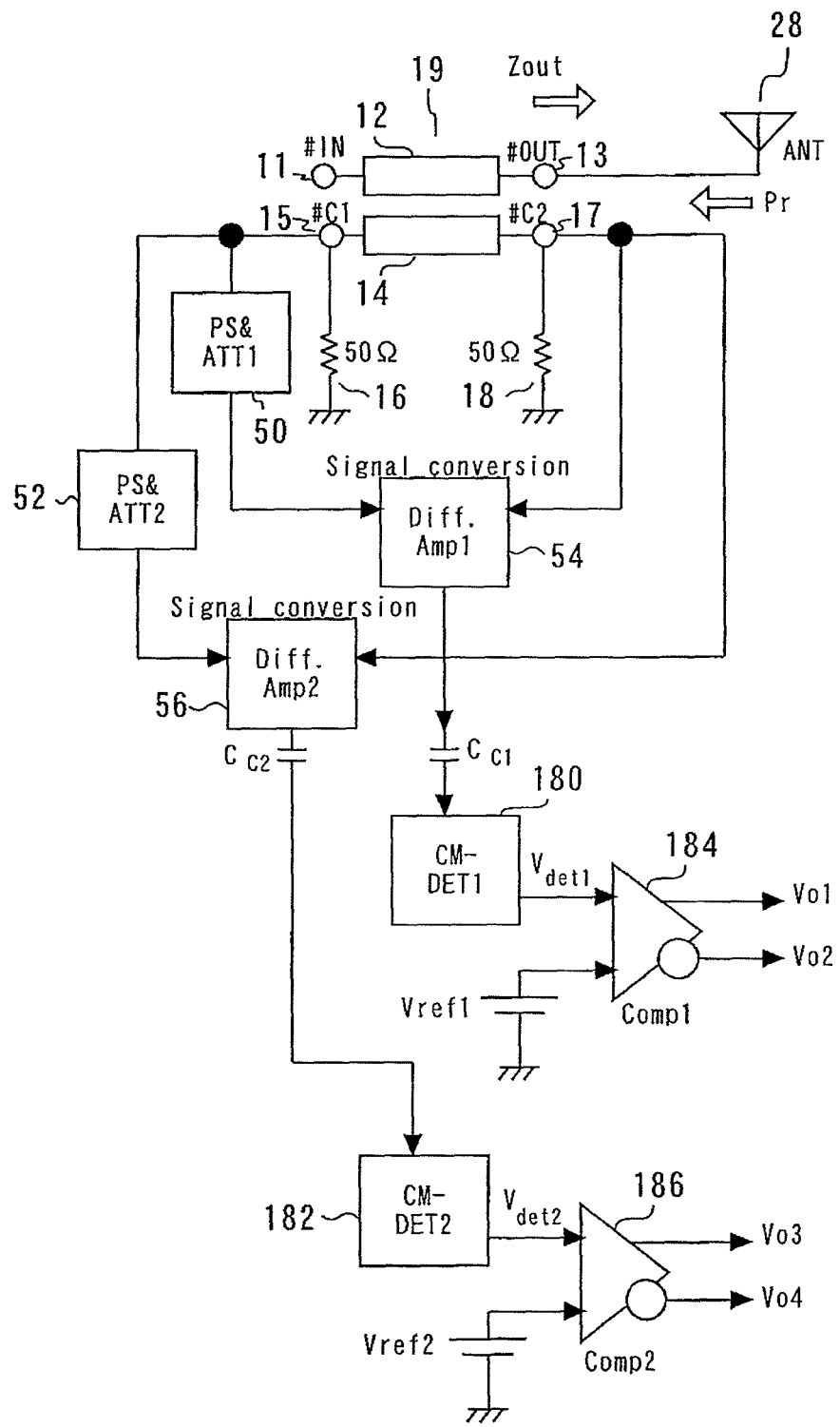
FIG. 8 shows circuit diagram wherein the wave detector circuit and the comparing circuit are connected with respect to each differential amplifier.

Although in the present embodiment the detector circuit includes only one wave detector circuit 24 and only one comparing circuit 26, it is to be understood that the invention is not limited to this particular construction. In other embodiments, the detector circuit may include two wave circuits 180 and 182 and two comparing circuit 184 and 186, as shown in FIG. 8, wherein the wave detector circuit 180 and the comparing circuit 184 are connected to, or associated with, the differential amplifier 54 and the phase shifter/attenuator 50, and wherein the wave detector circuit 182 and the comparing circuit 186 are connected to, or associated with, the differential amplifier 56 and the phase shifter/attenuator 52.

Third Embodiment

A third embodiment of the present invention provides a detector circuit capable of handling a larger dynamic range of input signals than the detector circuits of the first and second embodiments. The present embodiment will be described with reference to FIGS. 9, 10, and 11.

Figure 9:
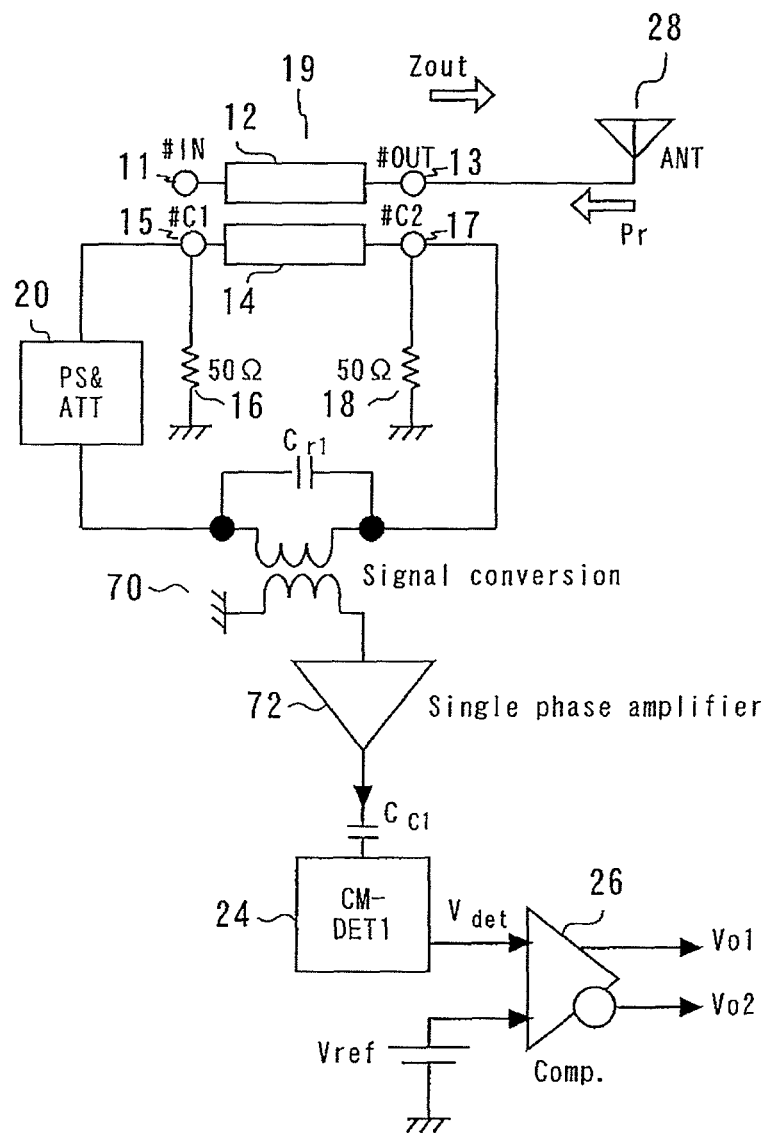
FIG. 9 is a circuit diagram illustrating the detector circuit of the third embodiment.

FIG. 9 is a circuit diagram illustrating the detector circuit of the present embodiment. This detector circuit differs from that of the first embodiment in that the differential amplifier is replaced by a balun (or balanced-to-unbalanced converter) 70, a parallel capacitor Cr1, and a single phase amplifier 72. This construction allows the detector circuit to handle a larger dynamic range of input signals, since the balun 70 is less likely to suffer input saturation than the differential amplifier. The need for the single phase amplifier 72 is determined by taking into account the level of the input power to the wave detector circuit 24. The use of the balun 70 degrades the isolation between the coupled terminal 15 (#C1) and the isolated terminal 17 (#C2). In order to prevent this degradation, the capacitance Cr1 is connected in parallel with the balun 70 (as shown in FIG. 9) so that the impedance of the balun 70 between the terminals #C1 and #C2 is high over the desired signal frequency range. This prevents the operation of the coupled line 14 from being affected by the balun 70. All other detection operations and advantages of the present embodiment are the same as those described in connection with the first embodiment.

Figure 10:
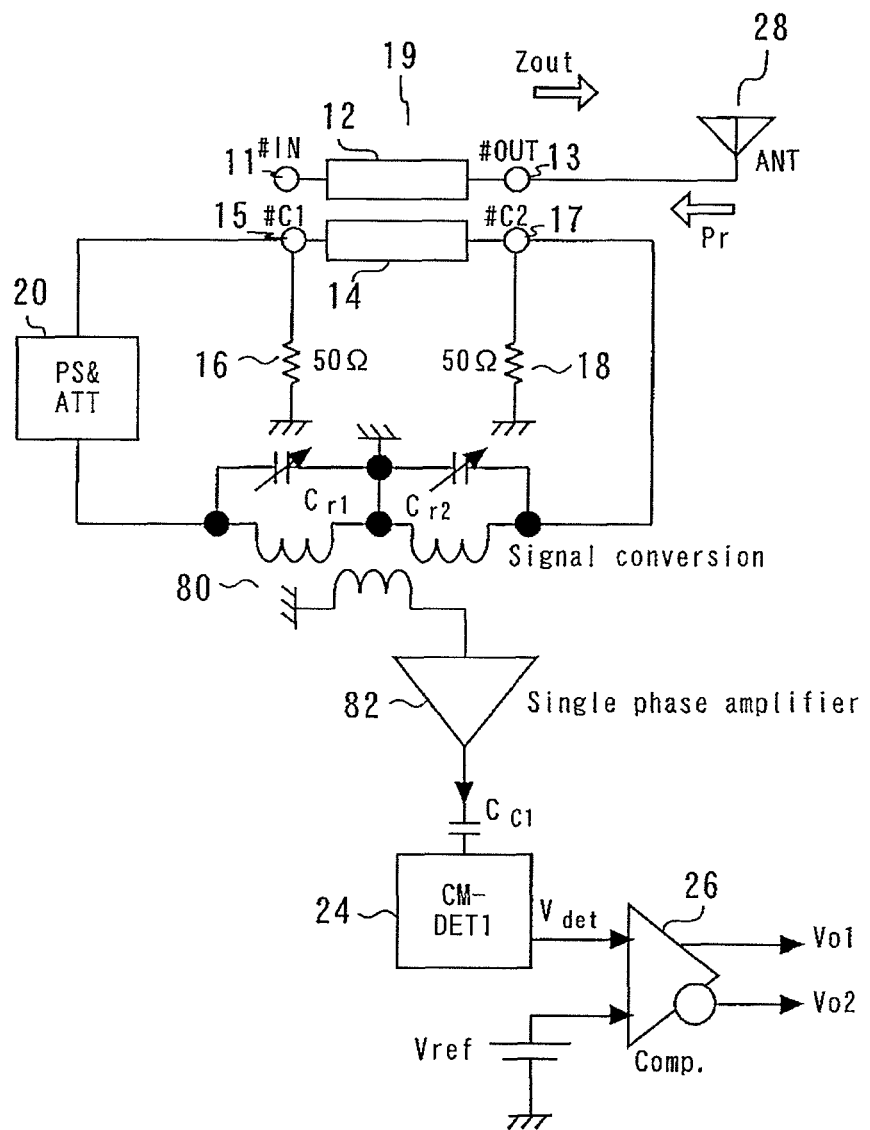
FIG. 10 is a circuit diagram illustrating the detector circuit with balun with center tap.

FIG. 10 is a diagram illustrating a variation of the detector circuit of the present embodiment. This detector circuit differs from that shown in FIG. 9 in that the balun 70 is replaced by a balun 80 with a center tap, and variable capacitors Cr1 and Cr2 are connected to the balun 80. The center tap of the balun 80 provides ground potential, facilitating the connection of a variable capacitor (such as indicated by the arrow in FIG. 6) to the balun 80.

Referring to FIG. 10, both the capacitances of the capacitors Cr1 and Cr2 and the capacitances of the capacitors of the phase shifter/attenuator may be varied so that the detector circuit (which includes the balun) has a wider detection frequency range. All other detection operations and advantages of this detector circuit are the same as those described in connection with the first embodiment.

Figure 11:
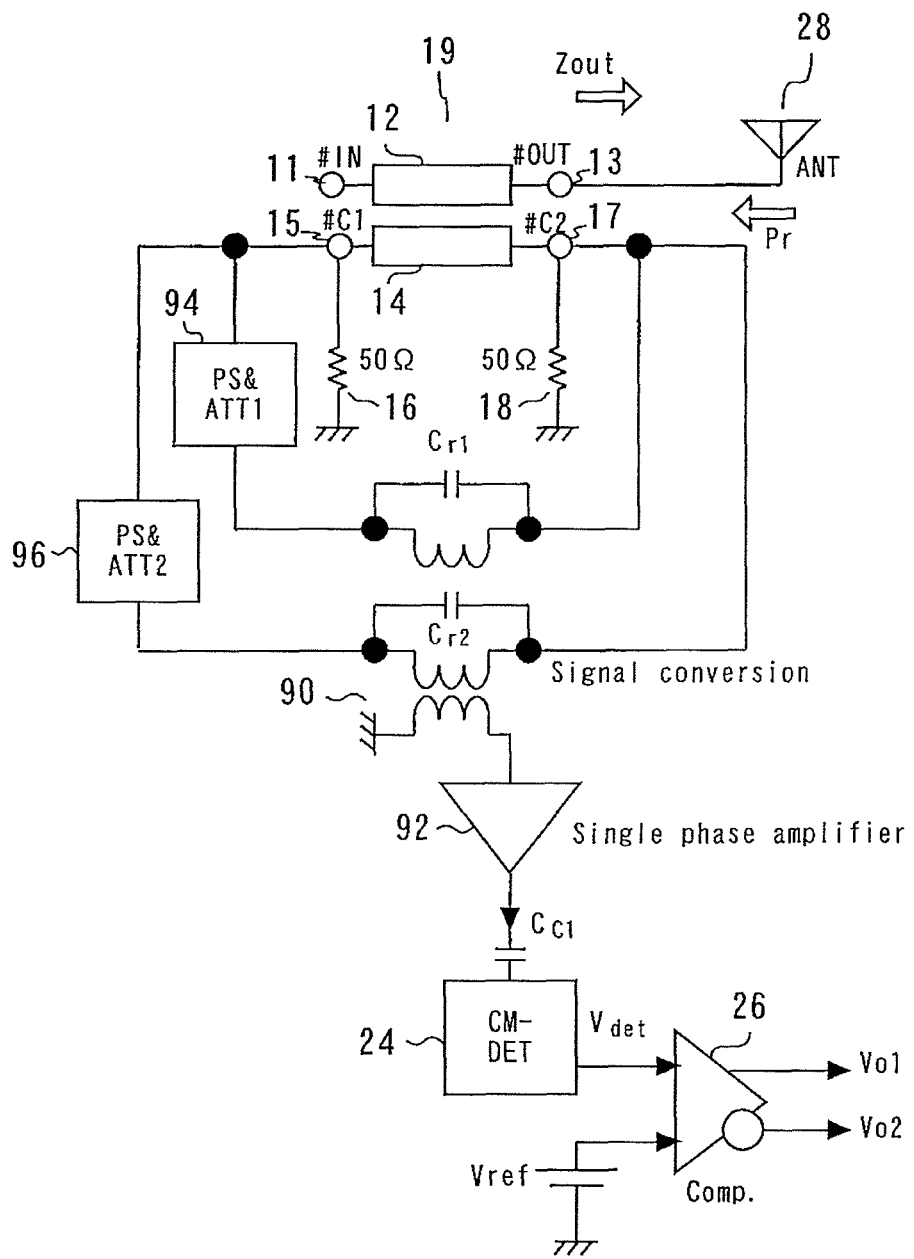
FIG. 11 is a circuit diagram illustrating the detector circuit with dual balun.

FIG. 11 is a diagram illustrating another variation of the detector circuit of the present embodiment. This detector circuit differs from that shown in FIG. 9 in that it includes two phase shifters/attenuators instead of one and includes a dual balun instead of the balun 70. More specifically, the detector circuit includes a first phase shifter/attenuator 94 and a second phase shifter/attenuator 96, and the outputs of these phase shifters/attenuators are input to the dual balun 90. The detector circuit includes these two phase shifters/attenuators to allow the following operation (as in the second embodiment). When the load conditions are those indicated by point A in FIG. 23, the resulting degradation in the distortion characteristics of the power amplifier is detected from the output of one of the phase shifter/attenuators; and when the load conditions are those indicated by point B in FIG. 23, the resulting degradation in the distortion characteristics of the power amplifier is detected from the output of the other phase shifter/attenuator. That is, the first phase shifter/attenuator 94 and the second phase shifter/attenuator 96 phase shift and attenuate the signal from the coupled terminal 15 so that the distortion characteristics of the power amplifier can be detected under different load conditions at the antenna end.

The wave detector circuit 24 is connected to the dual balun 90 through a single phase amplifier 92. This construction eliminates the need for having two wave detector circuits, so that the detector circuit is small and simple in construction. Further, this construction allows the power outputs from the phase shifters/attenuators 94 and 96 to cancel out each other before they are input to the wave detector circuit 24, except under the load conditions indicated by points A and B in FIG. 23 and similar load conditions, resulting in "steep" detection characteristics. This detector circuit also has all the advantages of the first embodiment.

Fourth Embodiment

A fourth embodiment of the present invention relates to a detector circuit which receives signals from a plurality of coupled lines. The present embodiment will be described with reference to FIG. 12.

Figure 12:
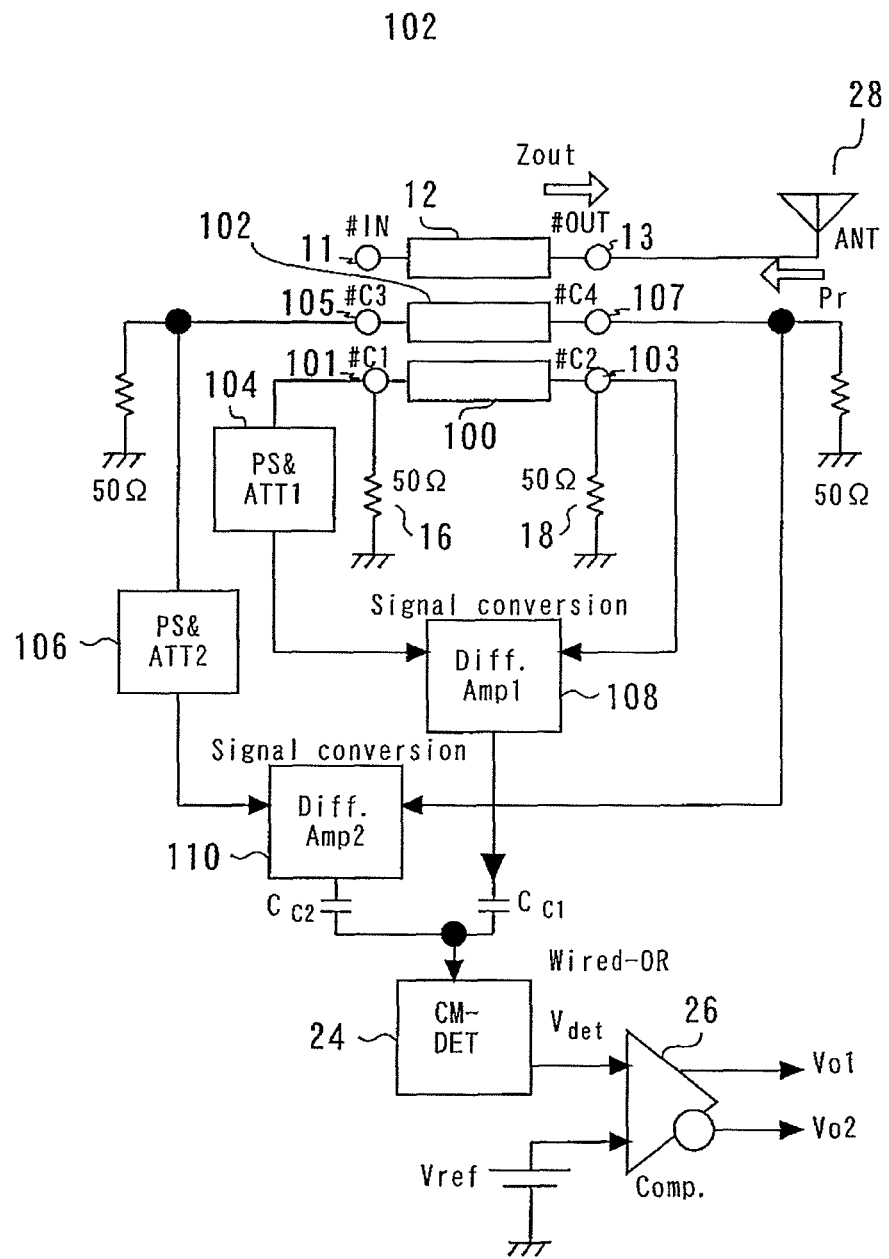
FIG. 12 is a circuit diagram illustrating the detector circuit of the fourth embodiment.

FIG. 12 is a circuit diagram illustrating the detector circuit of the present embodiment. The detector circuit shown in FIG. 12 is similar to that of the second embodiment except that it uses signals from two coupled lines. More specifically, the signal from the coupled terminal 101 of a first coupled line 100 is phase shifted and attenuated by a first phase shifter/attenuator 104 and input to a first differential amplifier 108. Further, the signal from the isolated terminal 103 of the first coupled line is also input to the first differential amplifier 108. On the other hand, the signal from the coupled terminal 105 of a second coupled line 102 is phase shifted and attenuated by a second phase shifter/attenuator 106 and input to a second differential amplifier 110. Further, the signal from the isolated terminal 107 of the second coupled line 102 is also input to the second differential amplifier 110.

This construction allows one to design the first phase shifter/attenuator 104 and the second phase shifter/attenuator 106 separately, thereby facilitating the design of the detector circuit. That is, the connection of two phase shifters/attenuators to a single coupled line, as in the second embodiment, complicates the design of the detector circuit. The construction of the detector circuit of the present embodiment avoids this by including two coupled lines. The present embodiment also has all the advantages of the second embodiment.

Fifth Embodiment

A fifth embodiment of the present invention relates to a detector circuit having a function to switch between a coupled line and a series connection of coupled lines. The present embodiment will be described with reference to FIGS. 13 and 14.

Figure 13:
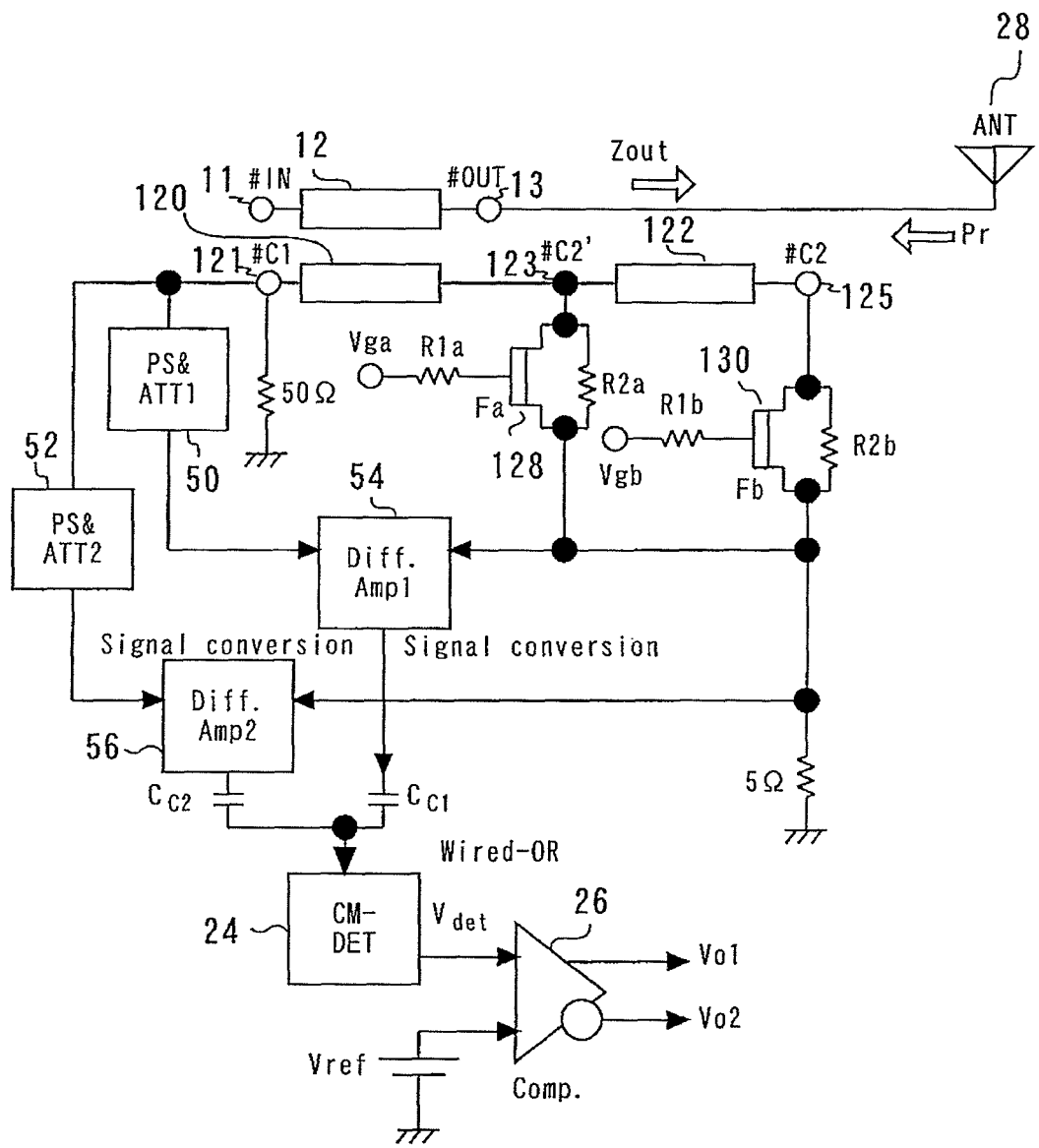
FIG. 13 is a circuit diagram illustrating the detector circuit of the fifth embodiment.

FIG. 13 is a circuit diagram illustrating the detector circuit of the present embodiment. The detector circuit shown in FIG. 13 is similar to that of the second embodiment, except that it is adapted to switch between a coupled line and a series connection of coupled lines and thereby switch between different electrical lengths. The detector circuit includes a first coupled line 120 and a second coupled line 122, as shown in FIG. 13.

The first coupled line 120 has a coupled terminal 121 (#C1) at one end and a first isolated terminal 123 (#C2') at the other end. The first isolated terminal 123 is connected to a first differential amplifier 54 and to a second differential amplifier 56 through a first switch 128 (Fa). When the first coupled line 120 and the second coupled line 122 together function as a single coupled line, the second isolated terminal 125 (#C2) of the second coupled line 122 serves as the isolated terminal of that coupled line (the series connection of coupled lines). The second isolated terminal 125 is connected to the first differential amplifier 54 and to the second differential amplifier 56 through a second switch 130 (Fb). Thus, the detector circuit of the present embodiment is characterized in that it can be switched between a coupled line and a series connection of coupled lines and thereby switched between different electrical lengths by turning on and off the first switch 128 and the second switch 130.

Specifically, when the first switch 128 is turned on and the second switch 130 is turned off, the first coupled line 120 alone functions as a coupled line. When the first switch 128 is turned off and the second switch 130 is turned on, on the other hand, the first coupled line 120 and the second coupled line 122 together function as a single coupled line. The phase shifters/attenuators may be constructed such that the amount of phase shift and the amount of attenuation produced by each phase shifter/attenuator can be varied to operate the detector circuit at two different frequencies while maintaining the coupling of the directional coupler substantially constant. Further, if the coupling is substantially equalized between two frequency bands, the detector circuit can be operated in these two frequency bands by varying only the amounts of phase shift produced by the phase shifters while maintaining the characteristics of the attenuators substantially constant. This eliminates the need for adjustment of the attenuators, allowing the detector circuit to be made small and simple in construction. The present embodiment also has all the advantages of the second embodiment.

Figure 14:
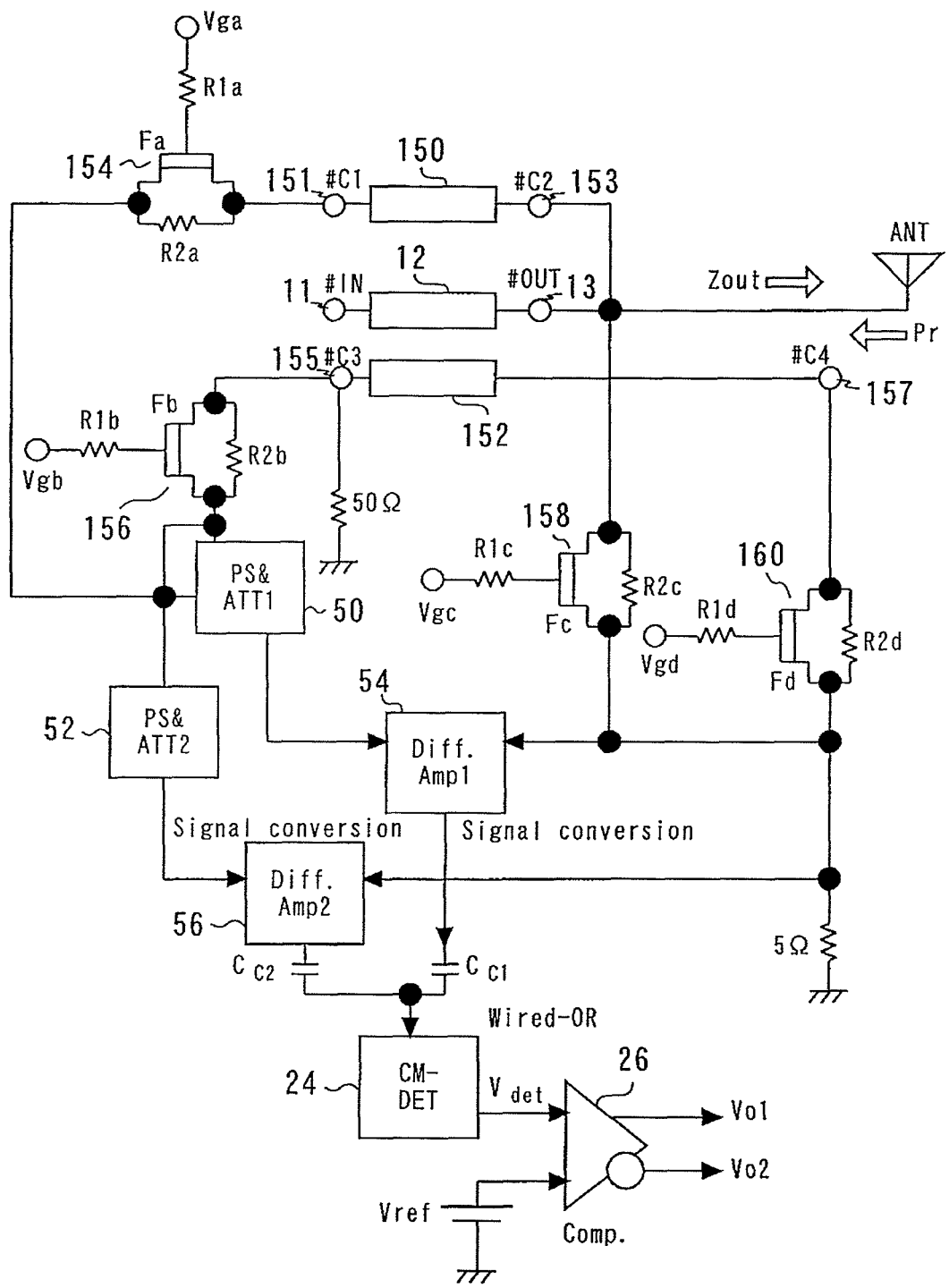
FIG. 14 is a circuit diagram illustrating the detector circuit having a function to switch between a coupled line and a series connection of coupled lines.

FIG. 14 is a diagram illustrating a variation of the detector circuit of the present embodiment. The detector circuit shown in FIG. 14 is similar in function to that shown in FIG. 13 but differs therefrom in that the detector circuit can be switched between two different coupled lines. As shown in FIG. 14, the coupled terminal 151 (#C1) of a first coupled line 150 is connected to a first phase shifter/attenuator 50 and to a second phase shifter/attenuator 52 through a first switch 154. The isolated terminal 153 (#C2) of the first coupled line 150 is connected to a first differential amplifier 54 and to a second differential amplifier 56 through a third switch 158. On the other hand, the coupled terminal 155 (#C3) of a second coupled line 152 is connected to the first phase shifter/attenuator 50 and to the second phase shifter/attenuator 52 through a second switch 156. The isolated terminal 157 (#C4) of the second coupled line 152 is connected to the first differential amplifier 54 and to the second differential amplifier 56 through a fourth switch 160.

It follows also from this construction that if the coupling is substantially equalized between two frequency bands, the detector circuit can be operated in these two frequency bands by varying only the amounts of phase shift produced by the phase shifters while maintaining the characteristics of the attenuators substantially constant. This eliminates the need for adjustment of the attenuators, allowing the detector circuit to be made small and simple in construction.

Sixth Embodiment

A sixth embodiment of the present invention provides a semiconductor device (e.g., portable terminal) in which the detector circuit shown in FIG. 1 is incorporated in the transmitter front end. That is, this semiconductor device uses the detector circuit to control the load of its power amplifier. The present embodiment will be described with reference to FIGS. 15 and 16.

Figure 15:
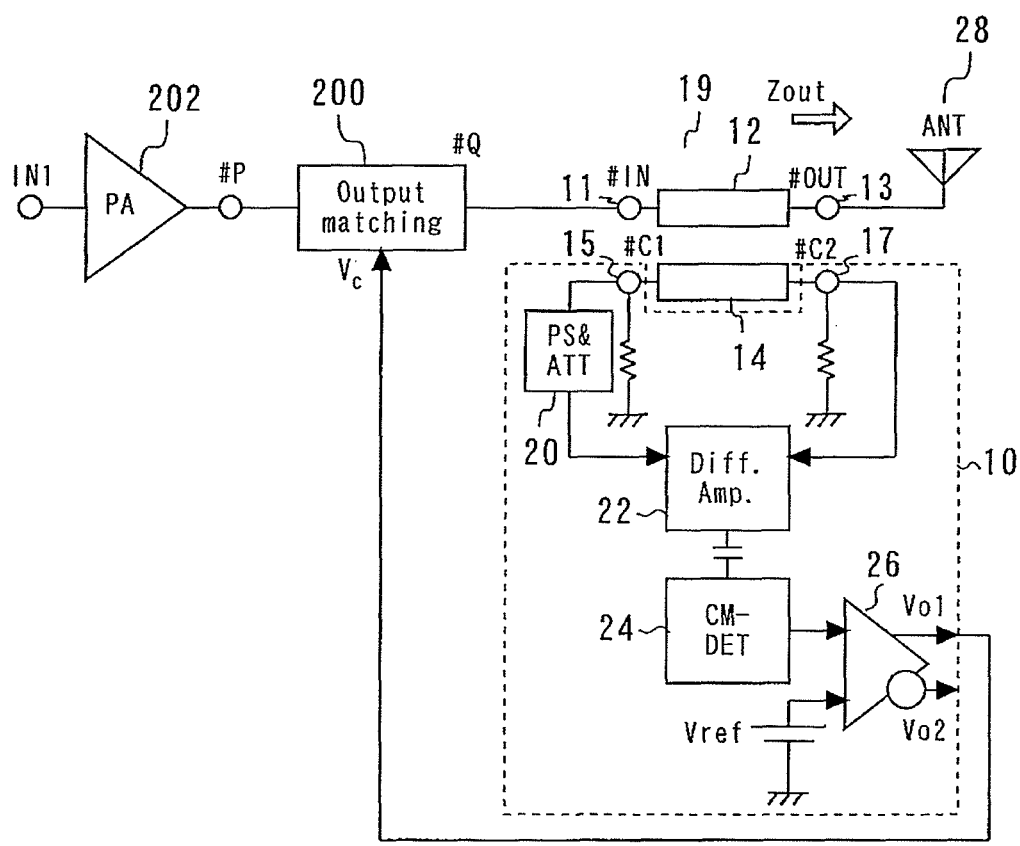
FIG. 15 is a circuit diagram of the semiconductor device of the sixth embodiment.
Figure 16:
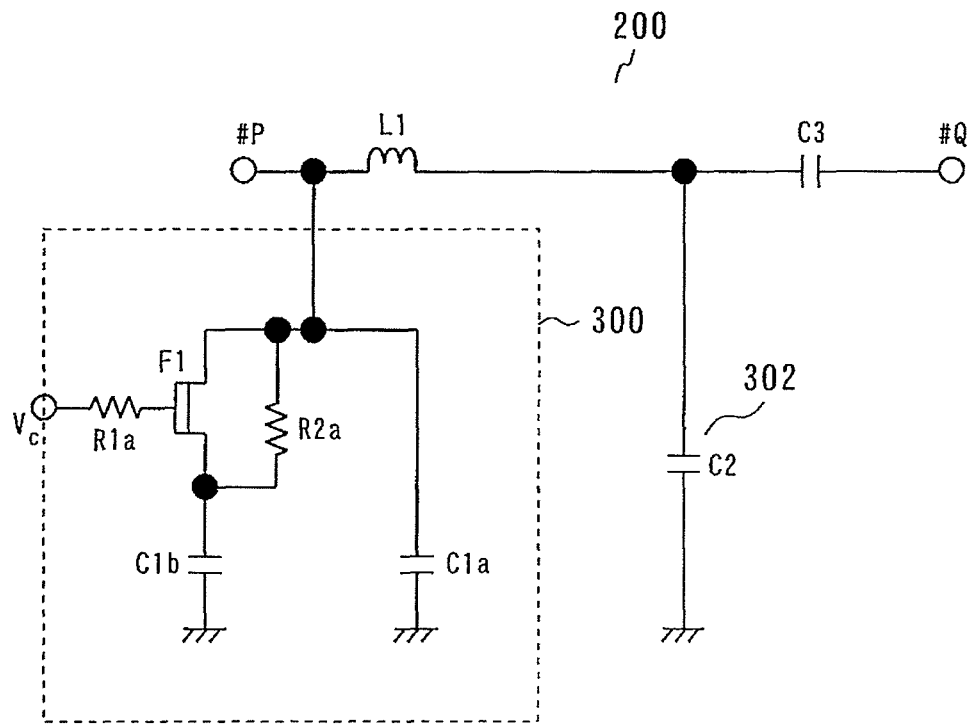
FIG. 16 shows the detailed configuration of the output matching circuit.

FIG. 15 is a circuit diagram of the semiconductor device of the present embodiment. This semiconductor device includes a power amplifier 202 which is not a balanced power amplifier. An output matching circuit 200 is connected to the output of the power amplifier 202. FIG. 16 shows the detailed configuration of the output matching circuit 200. A directional coupler 19 is connected to the output of the output matching circuit 200, and an antenna 28 is connected to the output of the directional coupler 19.

Figure 4:
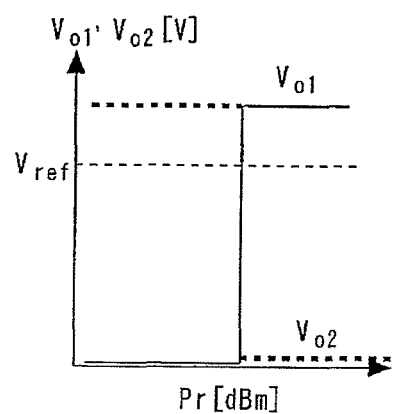
FIG. 4 shows the output of the comparing circuit.
Figure 5:
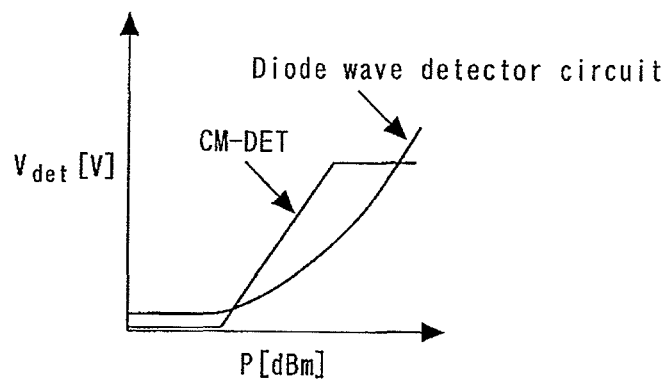
FIG. 5 shows non-steep wave detection characteristic.
Figure 6:
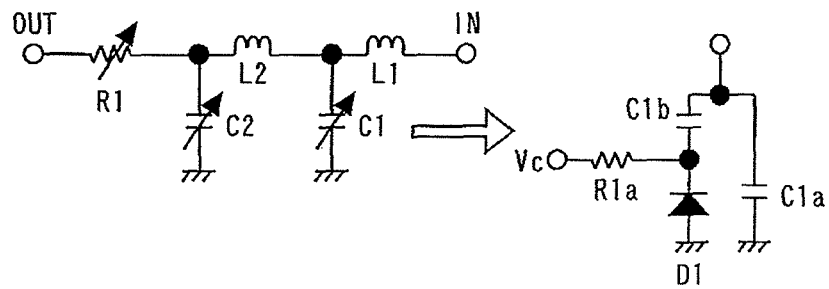
FIG. 6 shows the construction of the phase shifter.

Further, a detector circuit 10 (shown enclosed by the dashed line in FIG. 15) is connected to a coupled line 14. One output Vo1 of the detector circuit 10 is connected to a terminal Vc of the output matching circuit 200. Referring now to FIG. 16, in the output matching circuit 200, the terminal Vc is connected to the gate of a switch F1 in a variable capacitor 300, which switch is used to adjust the capacitance of the capacitor. The variable capacitor 300 is constructed so that when the output Vo1 of the detector circuit 10 is at a High level (as shown in FIG. 4), the capacitance of the variable capacitor 300 is increased.

Figure 17:
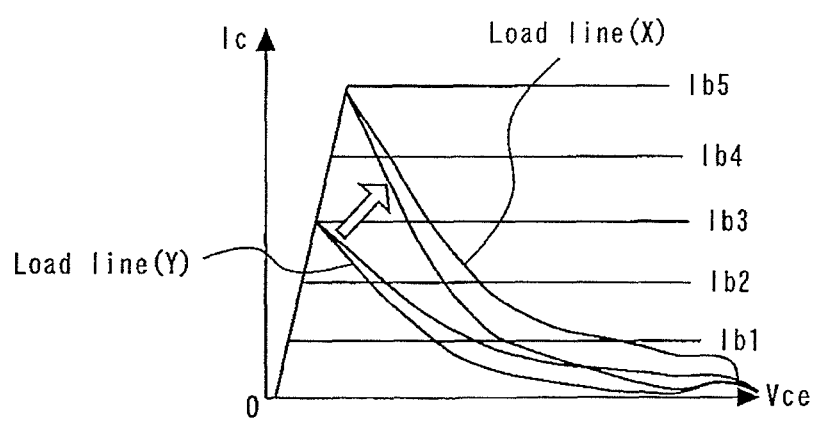
FIG. 17 shows the improved load lines by using the detector circuit.

The load lines of the power amplifier will now be described with reference to FIG. 17. In FIG. 17, the load line (X) is the 50Ω load line (i.e., the ideal load line of the power amplifier). Further, the load line (Y) is the load line of the power amplifier in a conventional semiconductor device of the type herein concerned when the load conditions at the antenna end are those indicated by point A in FIG. 23. The difference between these two load lines results from the degradation of the distortion characteristics of the power amplifier when the load conditions at the antenna end are those indicated by point A. In the semiconductor device of the present embodiment, on the other hand, the load line of the power amplifier remains identical to the 50Ω load line (X) of FIG. 17 even when the load conditions at the antenna end are those indicated by point A in FIG. 23, since under such load conditions the output Vo1 of the detector circuit 10 is at a High level and hence the capacitance of the variable capacitor 300 in the output matching circuit 200 is increased. This prevents degradation of the distortion characteristics of the power amplifier when the load conditions at the antenna end are those indicated by point A. Thus in the present embodiment, the output from the comparing circuit 26 is used to vary the load impedance of the power amplifier. This makes it possible to prevent degradation of the distortion characteristics of even common power amplifiers due to load variations.

Thus, in the semiconductor device of the present embodiment, the output of the comparing circuit in the detector circuit is used to vary the load impedance of the power amplifier so as to prevent degradation of the distortion characteristics of the amplifier. Although the semiconductor device of the present embodiment employs the detector circuit 10 of the first embodiment, it is to be understood that the detector circuit of any one of the embodiments described above may be used to implement the concept of the present embodiment while retaining the advantages noted above.

Figure 19:
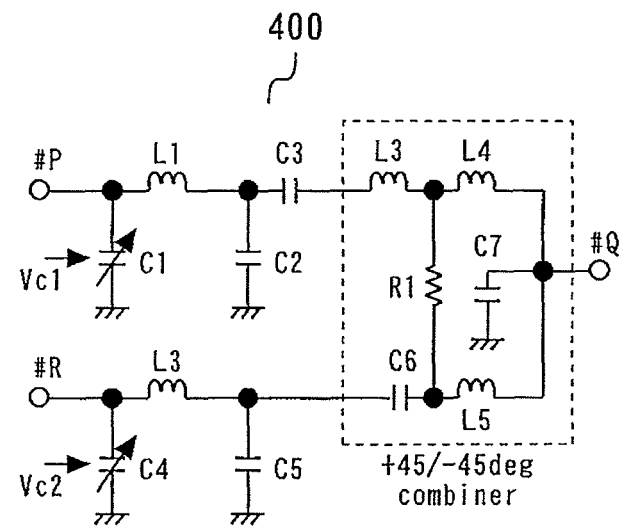
FIG. 19 shows the detailed configuration of the output matching circuit.
Figure 20:
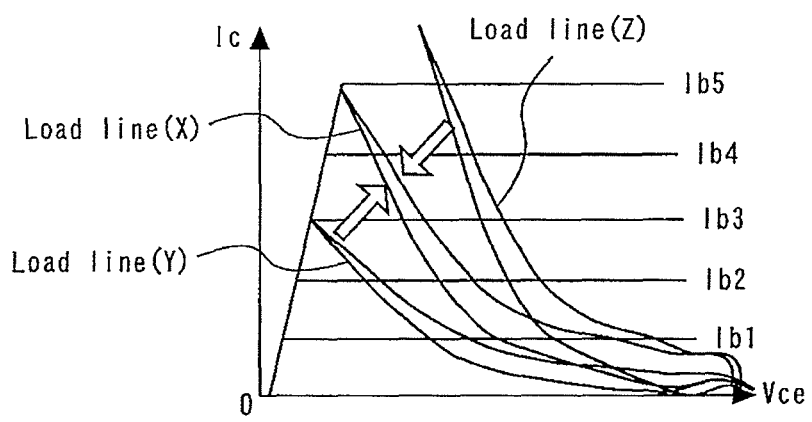
FIG. 20 shows the improved load line by using the detector circuit.
Figure 21:
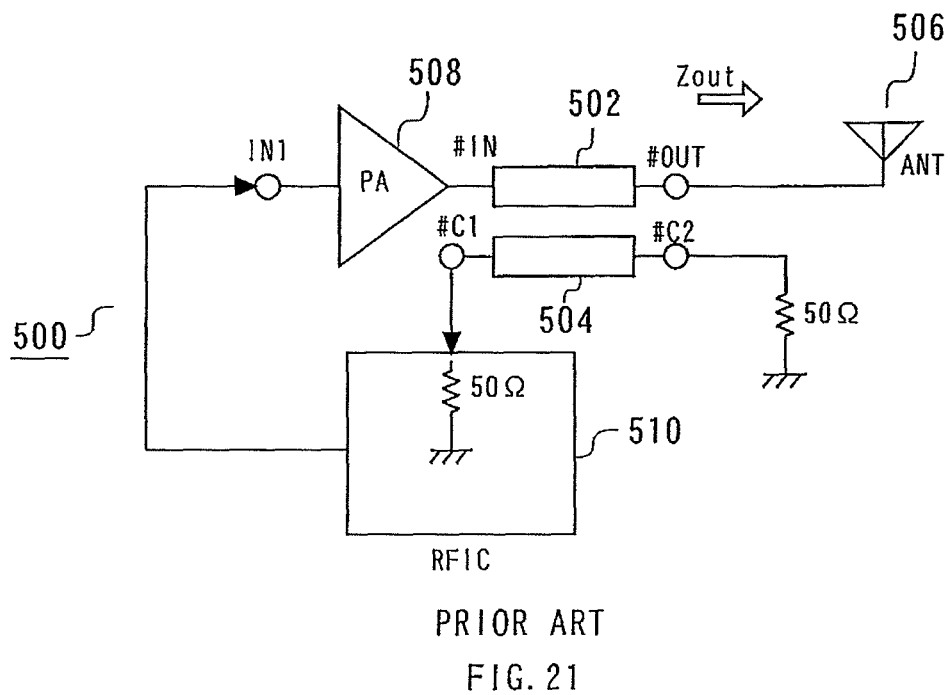
FIG. 21 shows the known semiconductor device.
Figure 22:
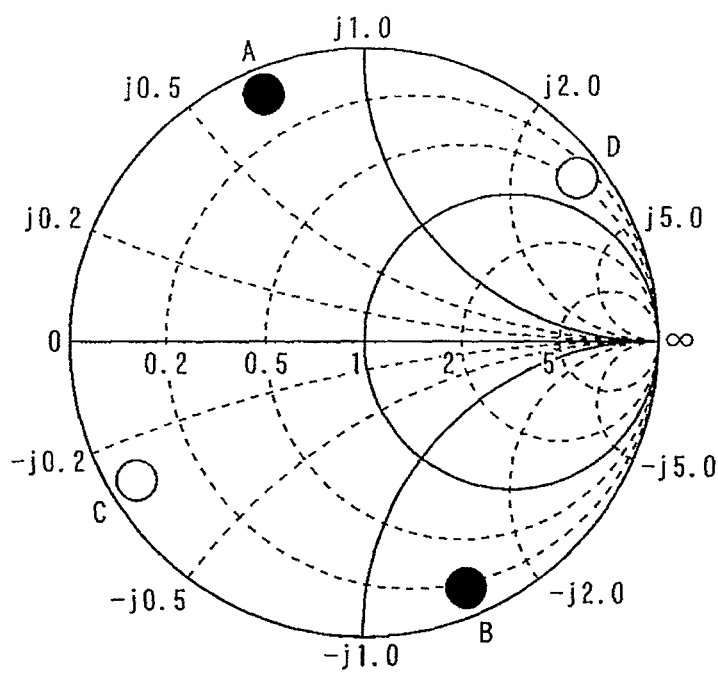
FIG. 22 shows variations in the load impedance at the antenna end.

Such a variation of the semiconductor device of the present embodiment will be described with reference to FIGS. 18, 19, and 20. The semiconductor device shown in FIG. 18 employs the detector circuit shown in FIG. 7. The detector circuit shown in FIG. 7 is adapted to detect two different load conditions (e.g., those indicated by points A and B in FIG. 23) which cause a degradation in the distortion characteristics of the power amplifier.

Figure 18:
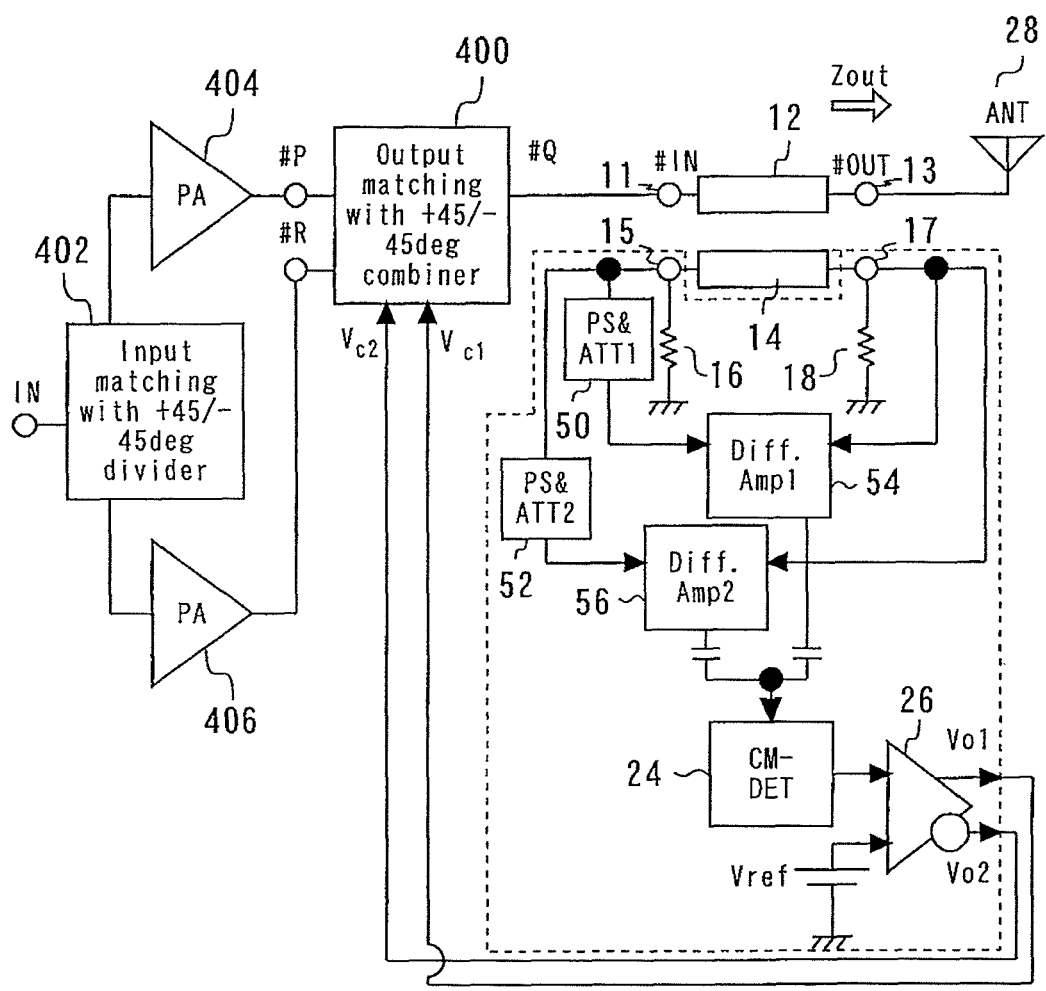
FIG. 18 shows the semiconductor device which uses the detector circuit of the second embodiment.

The semiconductor device shown in FIG. 18 includes balanced power amplifiers 404 and 406 connected to an input matching circuit 402. An output matching circuit 400 is connected to the outputs of the balanced power amplifiers 404 and 406. FIG. 19 shows the detailed configuration of the output matching circuit 400. A directional coupler 19 is connected to the output of the output matching circuit 400, and an antenna 28 is connected to the output of the directional coupler 19.

Further, a detector circuit (shown enclosed by the dashed line in FIG. 18) is connected to a coupled line 14. The outputs Vo1 and Vo2 of the detector circuit are connected to terminals Vc1 and Vc2, respectively, of the output matching circuit 400. Referring now to FIG. 19, in the output matching circuit 400, the terminal Vc1 is connected to the gate of a switch in a variable capacitor C1, which switch is used to adjust the capacitance of the capacitor. The terminal Vc2, on the other hand, is connected to the gate of a switch in a variable capacitor C4, which switch is used to adjust the capacitance of the capacitor. Though not specifically shown in FIG. 19, these variable capacitors C1 and C4 have the same construction as the variable capacitor 300 described above. The variable capacitor C1 is constructed so that its capacitance is increased when the output Vo1 of the detector circuit is at a High level (as shown in FIG. 4). The variable capacitor C4, on the other hand, is constructed so that its capacitance is increased when the output Vo2 of the detector circuit is at a High level.

The Load lines of the power amplifiers will now be described with reference to FIG. 20. In FIG. 20, the load line (X) is the 50Ω load line (i.e., the ideal load line of the power amplifiers). Further, the load line (Y) is the load line of one of the power amplifiers and the load line (Z) is the load line of the other power amplifier in a conventional semiconductor device of the type herein concerned when the load conditions at the antenna end are those indicated by points A and B in FIG. 23. In the semiconductor device shown in FIGS. 18 and 19, on the other hand, when the load conditions at the antenna end are those indicated by points A and B in FIG. 13, the voltages on the terminals Vc1 and Vc2 are at High and Low levels, respectively, or at Low and High levels, respectively, with the result that the capacitances of the capacitors C1 and C4 in the output matching circuit 400 are increased or decreased so that the load lines of both power amplifiers remain identical to the 50Ω load line (X) of FIG. 20. This makes it possible to improve the distortion characteristics of the balanced power amplifiers when the load conditions at the antenna end are those indicated by points A and B in FIG. 23, thus further improving the characteristics of these power amplifiers under load variations.

The features of the present invention will be described primarily with reference to the first embodiment discussed above. As described above, the detector circuit of the first embodiment of the invention is adapted to detect the reflection amplitude and phase at an antenna end under load variations, and includes a phase shifter/attenuator for adjusting the phase and amplitude of the signal from the coupled line of the directional coupler. The detector circuit also includes a wave detector circuit for detecting the power level of the RF signal and a comparing circuit for determining the power level. Further, the semiconductor device of the sixth embodiment of the present invention is adapted to use the signal from the detector circuit of the first embodiment and includes means for varying the load impedance of the power amplifier so as to prevent degradation of the distortion characteristics of the amplifier due to load variations.

With this circuit configuration, the above detector circuit of the present invention can detect the reflection amplitude and phase at the antenna end when the distortion in the output of the power amplifier is greatest under load variations. Further, the detection signal from the detector circuit may be used to vary the load impedance of the power amplifier. This makes it possible to prevent degradation of the distortion characteristics of even common power amplifiers due to load variations. That is, it is possible to efficiently prevent degradation of the distortion characteristics of a power amplifier by detecting specific load conditions which cause a degradation in the distortion characteristics of the amplifier. Further, the detector circuits of the present invention may be used with balanced power amplifiers to further reduce degradation of the distortion characteristics of the amplifiers due to load variations. Since the construction and operating principle of the detector circuits of the present invention are simple, they can be manufactured by a GaAs-HBT process or a GaAs-BiFET process (including only n-channel FETs or npn transistors), which are often used to manufacture power amplifiers. This means that the detector circuits can be easily incorporated in power amplifiers.

Thus, the present invention allows for an easy and low coat way to prevent degradation of the distortion characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-023029, filed on Feb. 4, 2010 including specification, claims, drawings and summary, on which the Convention priority of the present application is based, are incorporated herein by reference in its entirety.

What is claimed is:

1. A detector circuit for detecting degradation in distortion characteristics of a power amplifier based on signals derived from a coupled line of a directional coupler, wherein the directional coupler includes a main line connected to the power amplifier and to an antenna, and a coupled line having a coupled terminal at a first end of the coupled line and an isolated terminal at a second end of the coupled line, said detector circuit comprising:
   a phase shifter/attenuators connected to said coupled terminal of said coupled line of the directional coupler and shifting phase of the signal from said coupled terminal of said coupled line, and attenuating the signal from said coupled terminal of said coupled line and outputting an output signal;
   difference output means connected to and receiving the output signal from said phase shifter/attenuator and to said isolated terminal of said coupled line and outputting a difference signal representing difference between the output signal from said phase shifter/attenuator and the signal from said isolated terminal of said coupled line;
   a wave detector circuit for converting the difference signal into a DC signal; and
   a comparing circuit for determining whether voltage level of the DC signal exceeds a predetermined level, wherein, when load conditions at the antenna cause degradation in the distortion characteristics of the power amplifier, said phase shifter/attenuator phase shifts the signal from said coupled terminal of said coupled line so that the output signal of the said phase shifter/attenuator is 180° out of phase with the signal from said isolated terminal of said coupled line.

2. The detector circuit according to claim 1, wherein said difference output means is a differential amplifier.

3. The detector circuit according to claim 1, wherein the phase shift and the attenuation produced by said phase shifter/attenuator can be varied.

4. The detector circuit according to claim 1, wherein:
said phase shifter/attenuator includes a first phase shifter/attenuator and a second phase shifter/attenuator;
said difference output means includes first difference output means and second difference output means;
an output signal from said first phase shifter/attenuator is input to said first difference output means;
an output signal from said second phase shifter/attenuator is input to said second difference output means;
said first phase shifter/attenuator phase shifts a first signal and outputs a signal 180° out of phase with the signal from said isolated terminal of said coupled line; and
said second phase shifter/attenuator phase shifts a second signal, different from the first signal, and outputs a signal 180° out of phase with the signal from said isolated terminal of said coupled line.

5. The detector circuit according to claim 4, wherein said first and second difference output means comprise a single dual balun.

6. The detector circuit according to claim 4, wherein:
said coupled line includes a first coupled line and a second coupled line;
said first phase shifter/attenuator is connected to a coupled terminal of said first coupled line;
said second phase shifter/attenuator is connected to a coupled terminal of said second coupled line;
said first difference output means is connected to an isolated terminal of said first coupled line; and
said second difference output means is connected to an isolated terminal of said second coupled line.

7. The detector circuit according to claim 4, wherein:
said isolated terminal of said coupled line includes a first isolated terminal connected to an intermediate point of said coupled line and further includes a second isolated terminal connected to the second end of said coupled line;
said first and second difference output means are connected to said first isolated terminal through a first switch; and
said first and second difference output means are connected to said second isolated terminal through a second switch.

8. The detector circuit according to claim 1, wherein said difference output means is a balun.

9. The detector circuit according to claim 8, wherein:
said balun has a side connected to said phase shifter/attenuator and a grounded center point; and
said wave detector circuit includes a variable capacitor connected in parallel with said side of said balun.

10. The detector circuit according to claim 1, wherein said difference output means includes a balun and a single phase amplifier connected to an output of said balun.

11. A semiconductor device comprising:
a detector circuit for detecting degradation in distortion characteristics of a power amplifier based on signals derived from a coupled line of a directional coupler, wherein the directional coupler includes a main line connected to the power amplifier and to an antenna, and a coupled line having a coupled terminal at a first end of the coupled line and an isolated terminal at a second end of the coupled line, said detector circuit comprising:
  a phase shifter/attenuators connected to said coupled terminal of said coupled line of the directional coupler and shifting phase of the signal from said coupled terminal of said coupled line, and attenuating the signal from said coupled terminal of said coupled line and outputting an output signal;
  difference output means connected to and receiving the output signal from said phase shifter/attenuator and to said isolated terminal of said coupled line and outputting a difference signal representing difference between the output signal from said phase shifter/attenuator and the signal from said isolated terminal of said coupled line;
  a wave detector circuit for converting the difference signal into a DC signal; and
  a comparing circuit for determining whether voltage level of the DC signal exceeds a predetermined level, wherein, when load conditions at the antenna cause degradation in the distortion characteristics of the power amplifier, said phase shifter/attenuator phase shifts the signal from said coupled terminal of said coupled line so that the output signal is 180° out of phase with the signal from said isolated terminal of said coupled line; and
means for varying the load impedance of the power amplifier in accordance with the output from said comparing circuit to prevent degradation of the distortion characteristics.

* * * * *